United States Patent
Chang et al.

(10) Patent No.: US 8,106,664 B2
(45) Date of Patent: Jan. 31, 2012

(54) SYSTEM AND METHOD FOR CONDUCTING ACCELERATED SOFT ERROR RATE TESTING

(75) Inventors: Jung-Che Chang, Shanghai (CN); Wei-Ting Chien, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 741 days.

(21) Appl. No.: 12/197,952

(22) Filed: Aug. 25, 2008

(65) Prior Publication Data
US 2010/0001738 A1  Jan. 7, 2010

(30) Foreign Application Priority Data
Jul. 3, 2008  (CN) .......................... 2008 1 0040292

(51) Int. Cl.
*G01R 31/00* (2006.01)
*G01R 31/26* (2006.01)
(52) U.S. Cl. .................................. 324/501; 324/762.01
(58) Field of Classification Search ........................ None
See application file for complete search history.

(56) References Cited

U.S. PATENT DOCUMENTS

| | | | |
|---|---|---|---|
| 5,850,145 A * | 12/1998 | Burroughs et al. | 324/750.14 |
| 6,853,207 B2 * | 2/2005 | Renfrow | 324/754.1 |
| 6,914,447 B2 * | 7/2005 | Baumann | 324/762.01 |
| 2006/0221654 A1 * | 10/2006 | Kawasaki et al. | 363/39 |

* cited by examiner

*Primary Examiner* — Paresh Patel
(74) *Attorney, Agent, or Firm* — Kilpatrick Townsend & Stockton LLP

(57) ABSTRACT

An apparatus for a user to conduct an accelerated soft error test (ASER) on a semiconductor sample is provided. The apparatus comprises a first component for holding the radiation source, where the radiation source may be either an alpha-particle or neutron-particle source. The apparatus comprises a second component for holding the semiconductor sample, where the semiconductor sample may be either a silicon wafer or semiconductor chip. The apparatus comprises a connecting assembly for placing the first component and the second component relative to each other at a plurality of positions that subject the semiconductor sample to a radiation stress from the radiation source at a plurality of stress efficiencies. Among the benefits provided are improved repeatability and credibility of ASER tests and reduced radiation exposures to operators of ASER tests.

53 Claims, 14 Drawing Sheets

_US 8,106,664 B2_

SYSTEM AND METHOD FOR CONDUCTING ACCELERATED SOFT ERROR RATE TESTING

CROSS-REFERENCES TO RELATED APPLICATIONS

The present application claims the benefit under 35 U.S.C. §119(a) of the following application, the entire disclosures of which, including any attached documents or appendices, are incorporated by reference: Chinese Patent Application No. 200810040292.6, filed Jul. 3, 2008 for "A System and Method for Conducting Accelerated Soft Error Rate Testing" (inventors Jung-Che Chang and Wei-Ting Chien).

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to a system and method for conducting an accelerated soft error rate (ASER) test on semiconductor samples including integrated circuits and semiconductor devices. More particularly, the invention provides for a system and method for carrying out accelerated soft error rate tests with credibility and reliability. The invention provides for a system and method for increasing the effectiveness by which soft error rates of semiconductor devices can be modeled and enhancing by which quality control can be implemented for semiconductor devices. The invention also provides for a system and method of carrying out accelerated soft error rate tests that reduce radiation exposure to an operator of the test. Merely by way of example, the invention can be used to perform testing of BIB or DUT boards in a way compliant with JEDEC standards. Based on the number of soft errors, it may be determined as whether the semiconductor is acceptable. There are other embodiments as well. It would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

As the gate oxide gets thinner and the cell density is increased due to continuous scaling and the rapid technology advancement, however, soft error rates (SER) of semiconductor devices become an increasingly important factor to ensure device reliability. A soft error (SE) is a random error induced by an event corrupting the data stored in a device but not permanently damaging any component on the device. A soft error can be caused by particle strikes including alpha particle strikes and neutron particle strikes. As part of today's standard manufacturing process, after the individual devices have been manufactured within an IC fabrication facility, the devices must be tested and packaged to ensure the reliability of the manufactured circuits. An important test is a test characterizing the soft error rate (SER) of the manufactured devices.

While an SER is not permanent, it often defines a chip's susceptibility to error and overall reliability. In the past, tests for SER had been optional. As of now, SER tests have become a mandatory test for many processes. In addition, SER of chips is an important measure of chip quality. Therefore, it is desirable to efficiently and reliably test SER of chips, especially during the semiconductor fabrication processes.

To properly test SER of chips, it is often necessary to simulate to conditions that cause SE on semiconductor chips or devices. One of the common causes of SE is particle strikes. Newer semiconductor chips are becoming increasingly susceptible to SE caused by particle strikes because of the increasing applications of integrated circuits in space where a lot more cosmic rays and particle strikes are expected. Conditions such as cosmic rays usually take effect over time. To speedily test SER of chips, the accelerated soft-error rate (ASER) is often determined, and it is measured by failure-in-time (FIT).

Soft errors can be caused by single-event upsets (SEU's), random, isolated events caused by passage of cosmic rays or transient ionizing particles such as alpha particles. A stray ionizing particles, for example, can generate enough free charge to flip a structure or device to its opposite state, thereby corrupting the operations of a device. In an integrated circuit (IC) chip package, emission of trace amounts of radioactive impurities is one cause of SEU's.

Accelerated soft-error rate (ASER) tests are a practical way of characterizing a semiconductor device's robustness to soft errors in an accelerated and shortened period. A typical ASER test measures a semiconductor device in terms of FIT (Failure In Time) given a known quantity of radiation source. In a typical ASER test, a radiation source is placed near a semiconductor device to be tested. Testing equipments are then attached to burn-in-boards (BIBs) or device-under-test (DUT) boards to record the failure in time the radiation source causes on the semiconductor being tested.

Accurate estimates of soft error rates (SER's) in electronic systems due to radiation exposure are desirable for the implementation of reliable systems. Examples of radiation sources include alpha particle sources with a known emission rate, such as, for example, a thorium foil. According to an embodiment, DUT boards include printed circuit boards that interface between a semiconductor device to be tested (e.g., an integrated circuit) and a test head attached to an automatic test equipment (ATE). DUT boards may be used to test individual chips of silicon wafers before they are cut free and packaged or to test packaged IC's.

In specialized applications such as space applications, soft error test is even important due to exposure from space radiation encountered in outer space. But in general, even in down-to-earth applications, concerns about soft error rates arising from high density devices means that tests of soft error rates are becoming mandatory in increasingly more and more applications. In many applications, for example, it is a challenge to maintain the common industrial standard for ASER, 1,000-FIT, on a 0.1 um or sub 0.1 um technology platform.

A problem with standard ASER tests is the sensitivity the test results depend on the parameters of a test. ASER tests are often conducted by skilled technicians trained to hold a well-characterized sample of radiation source at a distance from a DUT board. The specific distance and orientation at which the technician hold the radiation from the DUT board affect the radiation exposure of the semiconductor device and may thus drastically affect the ASER FIT measurements taken. A consequence is that test results are often sensitive to the technicians conducting the tests and are difficult to produce with high credibility or reliability.

Another problem with standard ASER tests is the risk technicians are subjected to harmful radiation exposure. While trained technicians usually handle radiation sources with protective gear, the close proximity by which technicians handle the radiation sources means that technicians can accidentally be subjected to unhealthful doses of harmful radiation in their daily routine. From the above, it can be seen that an improved technique for conducting ASER tests is desired.

BRIEF SUMMARY OF THE INVENTION

The present invention is directed to a system and method for conducting an accelerated soft error rate (ASER) test on semiconductor samples including integrated circuits and semiconductor devices. More particularly, the invention provides for a system and method for carrying out accelerated soft error rate tests with credibility and reliability. The invention provides for a system and method for increasing the effectiveness by which soft error rates of semiconductor devices can be modeled and enhancing by which quality control can be implemented for semiconductor devices. The invention also provides for a system and method of carrying out accelerated soft error rate tests that reduce radiation exposure to an operator of the test. Merely by way of example, the invention can be used to perform testing of BIB or DUT boards in a way compliant with JEDEC standards. Based on the number of soft errors, it may be determined as whether the semiconductor is acceptable. There are other embodiments as well. It would be recognized that the invention has a much broader range of applicability.

According to an embodiment, an apparatus for a user to conduct an accelerated soft error test (ASER) on a semiconductor sample using radiation from a radiation source is disclosed. The apparatus comprises a first component for holding the radiation source, where the first component is adapted to holding a radiation source of a plurality of sizes and shapes. The apparatus comprises a second component for holding the semiconductor sample, where the second component is adapted to holding a semiconductor material of a plurality of sizes and shapes. The radiation source may be either an alpha-particle or neutron-particle source. The semiconductor sample may be either a silicon wafer or semiconductor chip.

The apparatus also comprises a connecting assembly coupled to the first component and coupled to the second component. The connecting subassembly is adapted to place the first component and the second component relative to each other at a plurality of positions. According to the embodiment, the plurality of positions includes a plurality of testing positions. Each of the plurality of testing positions can be characterized by a Geometric Factor (GF) dictating a radiation stress to which the semiconductor sample is subjected from the radiation source. According to an embodiment, the stress efficiency by which a radiation stress is delivered is characterized by the Geometric Factor (GF), a particle flux associated with the radiation source, and a particle flux associated with the semiconductor sample.

The plurality of positions also includes a first loading position and a second loading position. According to an embodiment, the first loading position is configured to place the radiation source at a position and an orientation convenient for the user to load and unload the radiation source. The second loading position is configured to place the semiconductor sample at a position and an orientation convenient for the user to load and unload the semiconductor sample.

According to another embodiment, the connecting assembly includes an arm subassembly and a column assembly. The arm subassembly may be characterized by a length, where the length is adjustable. The column assembly may be characterized by a height, where the height is adjustable. According to an embodiment, the radiation source may be characterized by a first dimension, and the semiconductor sample is characterized by a second dimension, where the Geometric Factor is further characterized by the first dimension, the second dimension, and the height.

According to yet another embodiment, an apparatus includes a column assembly with a first surface and a scaling component, where the first surface is characterized by a first thread. According to the embodiment, the scaling component includes a second surface, where the second surface is characterized by a second thread. An exemplary first thread and the second thread are matching threads whereby an adjustment of the scaling component will result in a change of the height of the column assembly. According to an embodiment, the scaling component is a threaded screw.

According to yet another embodiment, a column assembly may be further characterized by a first end, and a second end. According to the embodiment, the arm subassembly of an apparatus is coupled to the column assembly toward the first end of the column subassembly. The second component is coupled to the column assembly toward the second end of the column subassembly. The arm subassembly is adapted to pivot about a longitudinal axis of the column subassembly.

According to yet another embodiment, the first component includes a dish-like subassembly characterized by a diameter. The first component may be adapted to vary the diameter. According to an embodiment, the first component includes a plurality of gripping components adapted to physically hold a semiconductor material of a plurality of sizes and shapes. The plurality of gripping components may include a plurality of springs. According to an embodiment, the plurality of gripping components is separated from each other by a plurality of distances, wherein each of the plurality of distances is adapted to be adjustable.

According to a specific embodiment, a plurality of gripping components are arranged in a plurality of gripping pairs, where each of the plurality of gripping pairs is associated with a plurality of gripping distances. Each of the gripping distances defines a distance by which each of the plurality of gripping components are separated. The plurality of gripping distances is adjustable to accommodate for a plurality of shapes and sizes of the radiation source. According to an embodiment, each of the plurality of distances is adapted to be adjusted independently of each other. According to another embodiment, some of the plurality of distances is adapted to be adjusted together.

According to an embodiment, the apparatus includes a second component that includes a soft or insulating pad. The semiconductor sample may be coupled to a device-under-test (DUT) board or a burn-in-board (BIB), where the semiconductor sample may be a silicon chip or a semiconductor wafer. According to an embodiment, either the semiconductor sample and/or the apparatus may be monitored and controlled by a computer system. According to an embodiment, the apparatus may include a first component further comprising an aperture shield assembly. The aperture shield assembly may be adapted to control an amount of radiation from the radiation source allowed to leave the first component. The aperture shield assembly may also be monitored and controlled by a computer system.

According to an embodiment, the invention provides for a method for a user to conduct an accelerated soft error test (ASER) on a semiconductor sample using radiation from a radiation source. The method comprises setting up and initializing an apparatus, providing for a radiation source, and providing for a semiconductor sample. The method comprises providing for a configuration of the apparatus, where the configuration places the radiation source and the semiconductor sample at a position characterized by a GF for an accelerated soft error test. The method includes commencing the accelerated soft error test and terminating the accelerated soft error test.

According to an embodiment, the method further comprises analyzing data obtained from the accelerated soft error test. The method further comprises providing for at least an additional configuration of the apparatus that place the radiation source and the semiconductor sample at additional positions for testing. The method further comprises providing for at least an additional radiation source and providing for an additional configuration for exposing the semiconductor sample with radiation from the additional radiation source.

According to an embodiment, the method comprises selecting a radiation source from a group of radiation sources including an alpha-particle source and a neutron-particle source. The method includes adjusting the length of an arm subassembly, height of a column subassembly of the apparatus, and opening of a shield subassembly—either manually by hand and/or mechanically by motorized components. The method includes adjusting an aperture component to control an amount of radiation allowed to leave the radiation source and expose the semiconductor sample. The method comprises providing for a burn-in-board (BIB) or device-under-test (DUT) board to which the semiconductor sample is coupled. The method comprises coupling signals from the semiconductor sample to a computer system.

The current invention provides many benefits. According to an embodiment, the invention improves the repeatability and credibility of accelerated soft error rate tests. The proposed tool and method can perform ASER tests at different controlled Geometric Factors (GF's) to help engineers obtain more credible and repeatable relationships between ASER failure rates and radiation stress. According to an embodiment, a GF can be fixed during a test. According to an embodiment a GF can be changed according to a precise and predetermined manner during a test.

According to an embodiment, a radiation source can be moved during a test such as by disturbances generated by nearby cooling fans. The improved design alleviates such concerns. According to an embodiment, the improved design allows a variety of radiation sources (e.g. alpha-particle and neutron-particle sources) and a variety of semiconductor samples (e.g. silicon wafers and semiconductor chips) to be tested. In addition, the improved tool also allows radiation sources and semiconductor samples of a variety of sizes and shapes to be tested. Some special care in design and manipulations may be required for the extremely small and extremely large radiation sources and semiconductor samples.

According to an embodiment, the invention enables operators of ASER tests to better control the position and orientation of a radiation source from a DUT board. According to a specific embodiment, the invention allows the distance from die-surface to alpha-particle source as defined in the JEDEC standard to be controlled, facilitating better characterizations of soft error rates in semiconductor devices, which can lead to improved quality control to minimize soft error rates.

According to another embodiment, the invention also reduces the risk by which operators are subjected to harmful radiation. According to an embodiment, the invention alleviates the need for technicians to hold a radiation source for a prolonged amount of time. This not only improves the quality of test results, but also reduces the risk by which operators are subjected to possibilities of radiation exposure.

DETAILED DESCRIPTION OF THE INVENTION

The present invention is directed to a system and method for conducting an accelerated soft error rate (ASER) test on semiconductor samples including integrated circuits and semiconductor devices. More particularly, the invention provides for a system and method for carrying out accelerated soft error rate tests with credibility and reliability. The invention provides for a system and method for increasing the effectiveness by which soft error rates of semiconductor devices can be modeled and enhancing by which quality control can be implemented for semiconductor devices. The invention also provides for a system and method of carrying out accelerated soft error rate tests that reduce radiation exposure to an operator of the test. Merely by way of example, the invention can be used to perform testing of BIB or DUT boards in a way compliant with JEDEC standards. Based on the number of soft errors, it may be determined as whether the semiconductor is acceptable. There are other embodiments as well. It would be recognized that the invention has a much broader range of applicability.

Figure 1A:
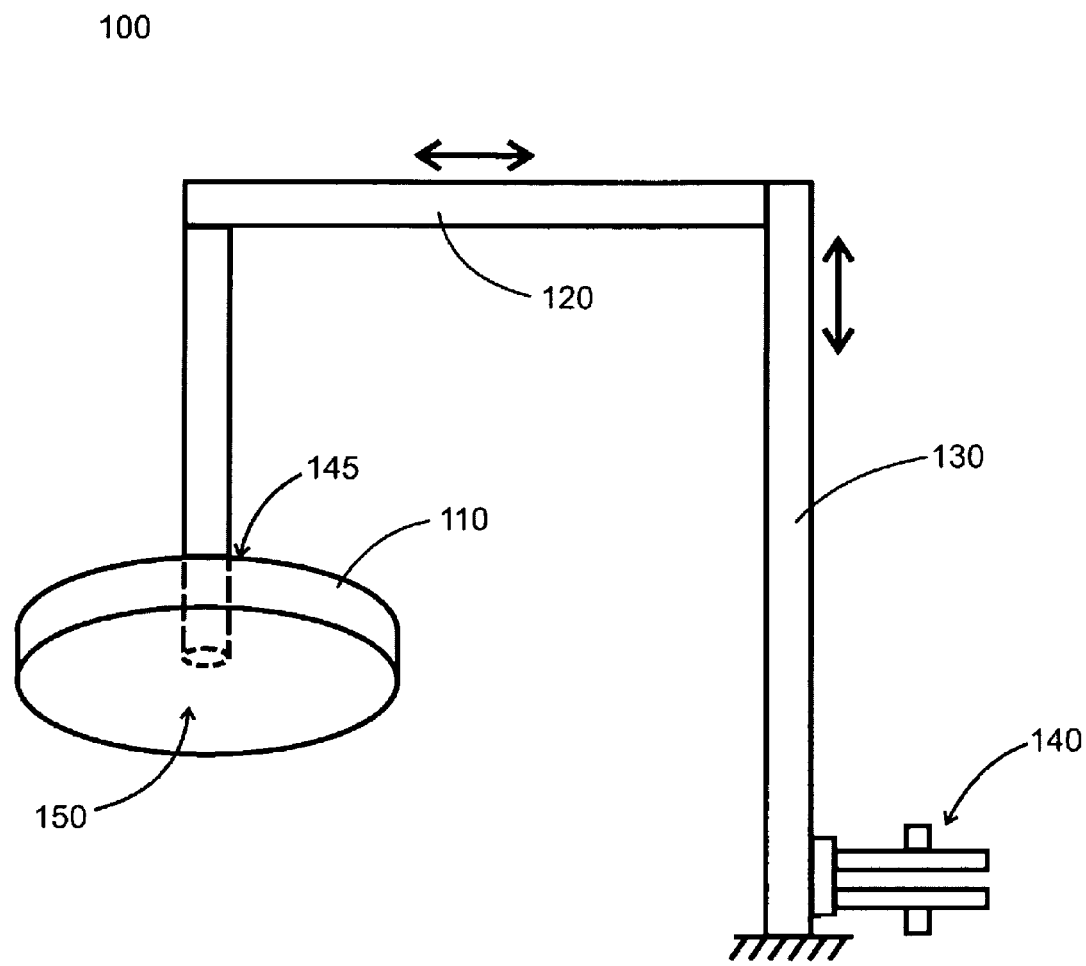
FIG. 1A is a simplified illustration of an apparatus comprising a radiation holder, an adjustable arm, and an adjustable column.

FIG. 1A is a simplified drawing of an apparatus 100 for a user to conduct an accelerated soft error test (ASER) on a semiconductor sample (not shown) with high precision and control. Various configurations are possible for conducting accelerated soft error rate tests, with some being more expensive and others being more cost effective than others. We successfully use the TDBI (Test During Burn-In) chamber as a cost-effective solution for ASER tests. According to an embodiment, the invention utilizes a TDBI chamber or a Tester (e.g., Mosaid 3490/4205, AdvanTest 5581) with BIB or DUT boards. The BIB or DUT boards may be equipped with insulating and soft contact pads. According to an embodiment, such BIB or DUT boards will not short or damage existing PCB coating and traces.

According to an embodiment, apparatus 100 comprises a radiation holder 110 for holding a radiation source (not shown), where radiation holder 110 is adapted to hold a radiation source of a plurality of sizes and shapes. Apparatus 100 also comprises a semiconductor sample holder 140, such as a BIB or DUT board, for holding a semiconductor sample (not shown), where the semiconductor sample holder 140 can be adapted to hold a semiconductor material of a plurality of sizes and shapes.

Apparatus 100 further comprises connecting assemblies 120 and 130 that couple radiation holder 110 and semiconductor sample holder 140. According to an embodiment, connecting arm 120 and connecting column 130 are adapted to place radiation holder 110 with respect to semiconductor sample holder 140 at a plurality of positions. One such position includes a loading position configured to place the radiation source at a position and an orientation convenient for the user to load and unload the radiation source. Another such position includes a loading position configured to place the semiconductor sample at a position and an orientation convenient for the user to load and unload the semiconductor sample. According to the embodiment, the plurality of positions also includes a plurality of testing configurations for testing. In an exemplary testing configuration, apparatus 100 exposes the semiconductor sample to a precise and controlled dose of radiation from the radiation resource.

According to the embodiment, apparatus 100 allows the radiation stress to be carefully controlled when the semiconductor sample is subjected to the radiation source. Apparatus 100 allows engineers to obtain test results that are credible and repeatable. This also allows engineers to use ASER test results to predict the performance of semiconductor devices in the real world.

Figure 1B:
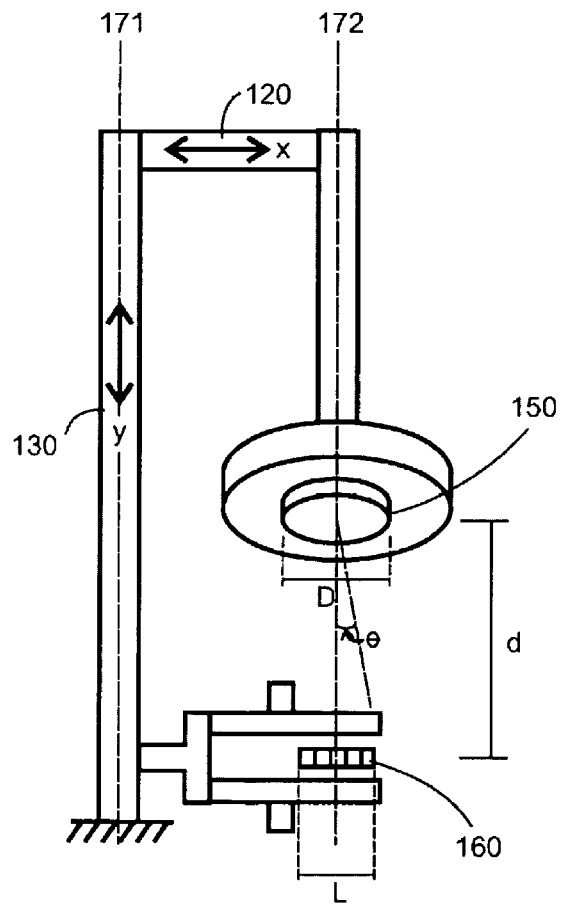
FIG. 1B is a simplified illustration of an apparatus holding a radiation sample and a semiconductor sample in a test configuration where the arm has been pivoted 180 degrees about an axis from the configuration shown in FIG. 1A.

FIG. 1B is a simplified drawing of apparatus 100 in a testing position. According to an embodiment, connecting arm 120 has a length this is adapted to be adjusted along an x direction, and connecting column 130 has a length that is adapted to be adjusted along a y direction. In addition, connecting arm 120 is also adapted to be rotated about an axis 171 (i.e. a longitudinal axis of connecting column 130) such that, together with the adjustment of the length of connecting arm 120, the center of radiation source 150 and the center of semiconductor sample 160 can be lined up along an axis 172. The height of connecting column 130 is adjusted to vary the distance d between radiation source 150 and the semiconductor sample 160.

Figure 1C:
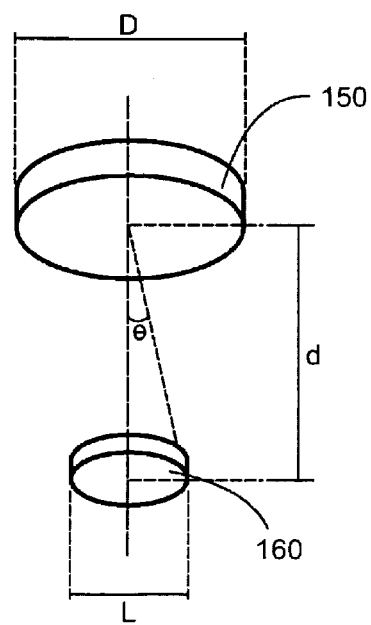
FIG. 1C is a simplified and expanded view of the test configuration shown in FIG. 1B.

FIG. 1C is a simplified drawing of a close-up of radiation source 150 and semiconductor sample 160 in a testing configuration as illustrated in FIG. 1B. According to the embodiment, radiation source 150 is characterized by a dimension D, and semiconductor sample 160 is characterized by a dimension L. In a test configuration, radiation source 150 and semiconductor sample 160 can be placed parallel to each other and at a distance d apart from each other.

According to an embodiment, the distance d between radiation source 150 and semiconductor sample 160 can be carefully varied to control a parameter of ASER tests called Geometric Factor (GF). Geometric Factor can be used to describe a stress efficiency by which a semiconductor sample is subjected to radiation from a radiation source. According to the embodiment, Geometric Factor (GF) can be described in terms of D, L, d, and θ, where θ is an angle formed from the center of radiation source 150 to an edge of semiconductor sample 160. Careful changes in GF will lead to controlled changes in the radiation (i.e. radiation stress) to which a semiconductor test sample is exposed.

According to an embodiment, the robustness of a semiconductor sample to soft error rates can often be characterized by an ASER FIT level. An exemplary FIT level can be expressed as in Equation 1.

$$FIT = \frac{FB \cdot 10^9}{AC \cdot T} \qquad \text{Equation 1}$$

In the embodiment, FB is the failure bit count, T is the test time, and AC is a parameter that measures a source accelerated factor. An exemplary source accelerated factor AC can be expressed as in Equation 2.

$$AC = Na \cdot \frac{GF}{Np} \qquad \text{Equation 2}$$

In the embodiment, Na is a measure of the source particle flux, Np is a measure of the compound particle flux (related to the radiation given out by the packaging of a semiconductor sample), and GF is the Geometric Factor of the test configuration. The JEDEC standard is a standard that is well recognized in the semiconductor industry. Under the JEDEC standard, an ASER test that gives credible, legitimate results should have a GF of between 0.2 and 1.0. According to an embodiment, an exemplary source particle source has a strength of 0.1 μCi to 5 μCi and a flux rate of between $1.36 \cdot 10^6$ alpha/cm$^2$ to $6.78 \cdot 10^7$ alpha/cm$^2$, and an exemplary semiconductor sample has a flux rate of around 0.001 alpha/cm$^2$.

According to an embodiment, the GF can be calculated by the Equation 3.

$$GF = 1 - \cos\theta \cdot \left(1 + \frac{3 \cdot L^2}{2 \cdot D^2} \cdot \frac{\sin^2(2 \cdot \theta)}{16}\right) \qquad \text{Equation 3}$$

According to an embodiment, L is a dimension of a semiconductor sample (e.g., a chip in a BIB or DUT board), D is a dimension of a radiation source (e.g., an alpha particle source or neutron particle source), and θ is an angle formed from a center of the radiation source to an edge of the semiconductor sample. For an illustration of the above parameters, please refer to FIGS. 1B and 1C. According to an embodiment, the dimension of a circular or approximately circular radiation source or semiconductor sample is simply the radius of the radiation source or semiconductor sample. According to an embodiment, the dimension of a rectangular or approximately rectangular radiation source or semiconductor sample with a width x and height y can be calculated by weighting the width x and height y. According to an embodiment, the weighting can be done by a formula such as Dimension=½ $\sqrt{(x^2+y^2)}$.

According to a preferred embodiment, a test configuration includes a rectangular semiconductor sample with a width and height of 0.6 cm and 0.7 cm, respectively, resulting in an effective dimension of 0.46 cm, and a circular alpha particular source with a radius of 1.25 cm. At a distance of 1 cm separating the radiation source and the semiconductor sample, and given a sample dimension of 0.46 cm and a source dimension of 1.25 cm, the GF can be calculated according to equation 3 to be $$\begin{aligned}GF &= 1 - \cos\theta \cdot \left(1 + \frac{3 \cdot L^2}{2 \cdot D^2} \cdot \frac{\sin^2(2 \cdot \theta)}{16}\right) \\ &= 1 - \cos(24.7°) \cdot \left(1 + \frac{3 \cdot .46^2}{2 \cdot 1.25^2} \cdot \frac{\sin^2(2 \cdot 24.7°)}{16}\right) \\ &= 0.1,\end{aligned}$$

where θ=24.7 degrees is calculated from θ=tan$^{-1}$(L/R)=tan$^{-1}$ (0.46/1)=24.7 degrees.

According to a preferred embodiment, the GF of an apparatus ranges from approximately 0.1 to 1 as the distance between the radiation source and the semiconductor sample is varied from 10 mm to approximately 1 mm. According to an embodiment, a test configuration with a distance d of 16.7 mm between the semiconductor sample and the radiation source gives a GF of 0.2, and a test configuration with a distance d of 1.0 mm between the semiconductor sample and the radiation source gives a GF of 1.0.

Figure 2A:
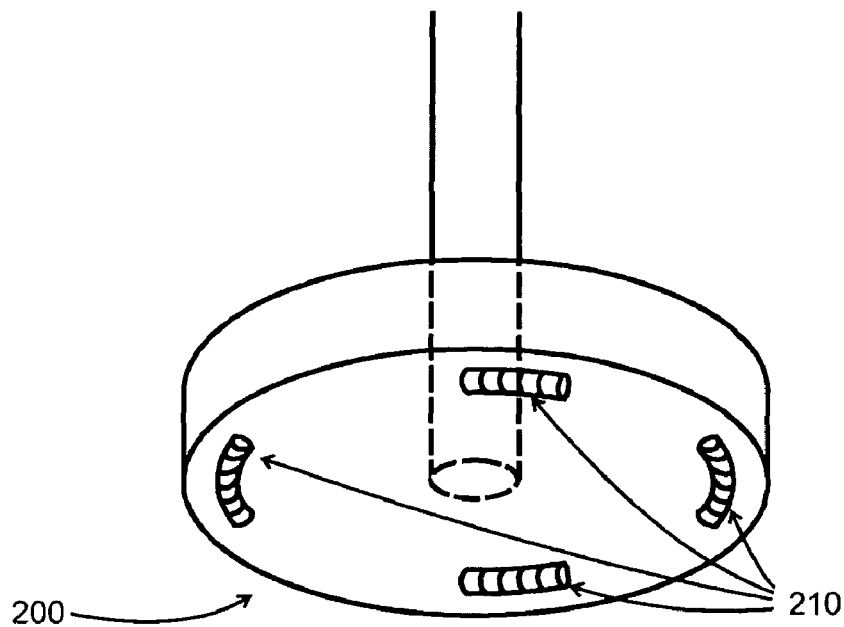
FIG. 2A is a simplified, close-up illustration of a radiation holder with 4 gripping components according to an aspect of the invention.

FIG. 2A is a simplified drawing of a semiconductor sample holder 200 with a plurality of gripping components 210 positioned along a boundary of semiconductor sample holder 200. According to an embodiment, a semiconductor sample holder 200 is approximately circular shaped and has four gripping components equally spaced apart about a circumference. Such a plurality of gripping components 210 is adapted to hold a semiconductor sample 205 of a plurality of shapes and sizes. According to an embodiment, individual gripping components are adapted to deform and make minor adjustments in its shapes and/or positions. The ability of individual gripping components to deform and make minor adjustments in positions enables plurality of gripping components to hold a semiconductor sample of a plurality of shapes and sizes.

Figure 2B:
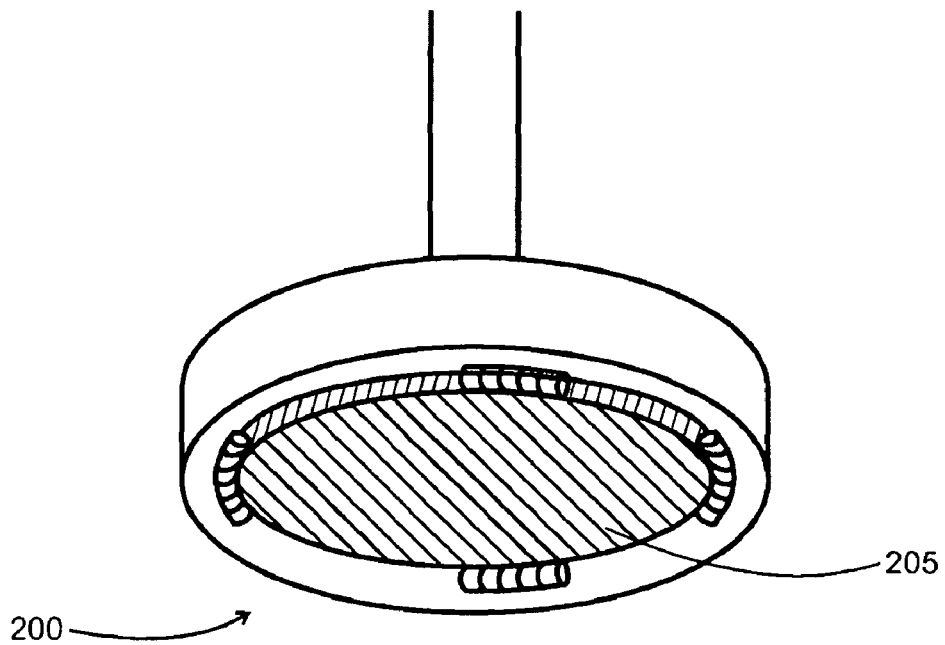
FIG. 2B is a simplified illustration of a radiation holder holding a radiation sample.

FIG. 2B is a simplified drawing of semiconductor sample holder 200 holding an exemplary semiconductor sample 205. According to a specific embodiment, each of the gripping components may be integrated with a spring system. According to another embodiment, each of the plurality of gripping components 210 may also be integrated with a soft padding and/or an insulating padding system. According to an embodiment, due partly to the elasticity of spring systems integrated with the gripping components, plurality of gripping components 210 is adapted to hold a semiconductor sample 205 of a range of variations in the shape and sizes.

Figure 3A:
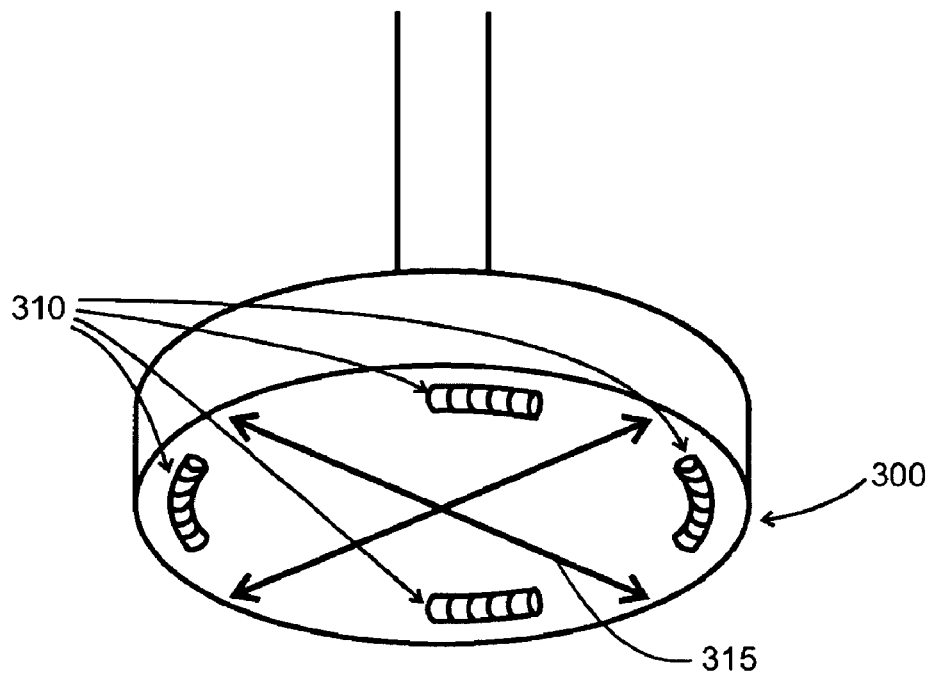
FIG. 3A is a simplified illustration of a radiation holder with a diameter where the diameter is adjustable.

FIG. 3A is a simplified drawing of a semiconductor sample holder 300 with a plurality of gripping components 310. According to an embodiment, semiconductor sample holder 300 has four gripping components equally spaced apart about a circumference. According to the embodiment, semiconductor sample holder 300 may be approximately circular in shape.

Figure 3B:
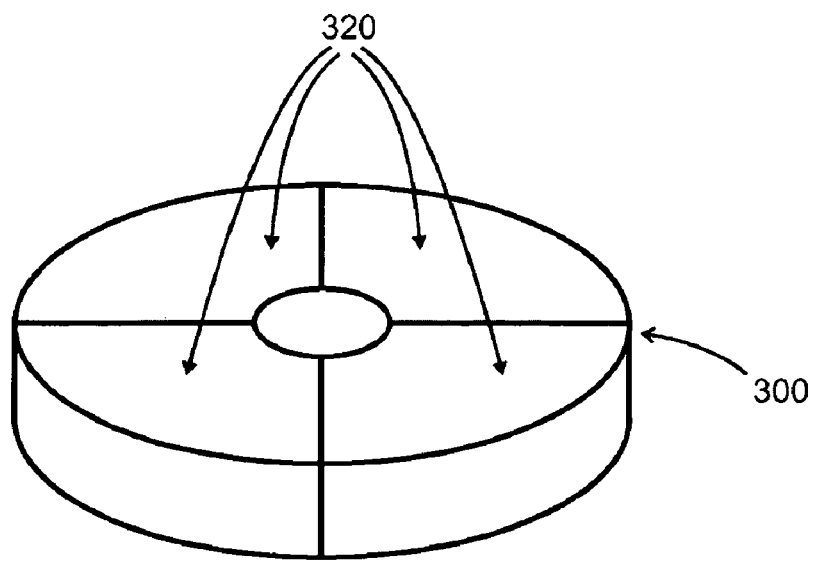
FIG. 3B is a simplified illustration of a top view of a radiation holder with a 4-plate section that can be adjusted to change a diameter of the radiation holder.

FIG. 3B is a simplified drawing of semiconductor sample holder 300 from a top view. According to the embodiment, semiconductor sample holder 300 contains a plurality of adjustable sections 320. The plurality of adjustable sections 320 can be adjusted to change the configuration of the plurality of adjustable sections 320. According to an embodiment, changes in configuration of the plurality of plurality of gripping components 310 enable plurality of gripping components 310 to be adapted to hold a semiconductor sample (not shown) of a plurality of shapes and sizes.

Figure 4A:
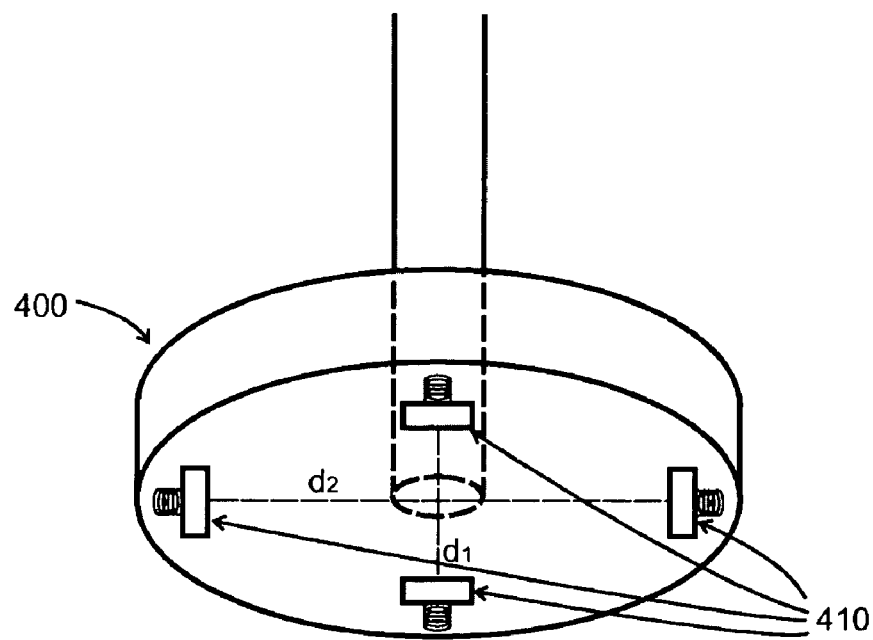
FIG. 4A is a simplified illustration of a radiation holder with 4 gripping components coupled with springs where the distances between the gripping components can be adjusted for the gripping components to hold a radiation source of a variety of shapes and sizes.

FIG. 4A is a simplified drawing of a semiconductor sample holder 400 with a plurality of spring-based gripping components 410 positioned along a boundary of semiconductor sample holder 400. According to an embodiment, a semiconductor sample holder 400 has four spring-based gripping components equally spaced apart about a circumference of semiconductor sample holder 400. The four spring-based gripping components are organized into two pairs of gripping components, each of the pairs shown connected by a dashed line.

According to an embodiment, a first pair of gripping components is separated from each other by a distance $d_1$. A second pair of gripping components is separated from each other by a distance $d_2$. The distances $d_1$ and $d_2$ can be adjustable. According to an embodiment, the distances $d_1$ and $d_2$ can be adjusted independently of each other. According to another embodiment, the distances $d_1$ and $d_2$ are dependent on each other and are adjusted together.

Figure 4B:
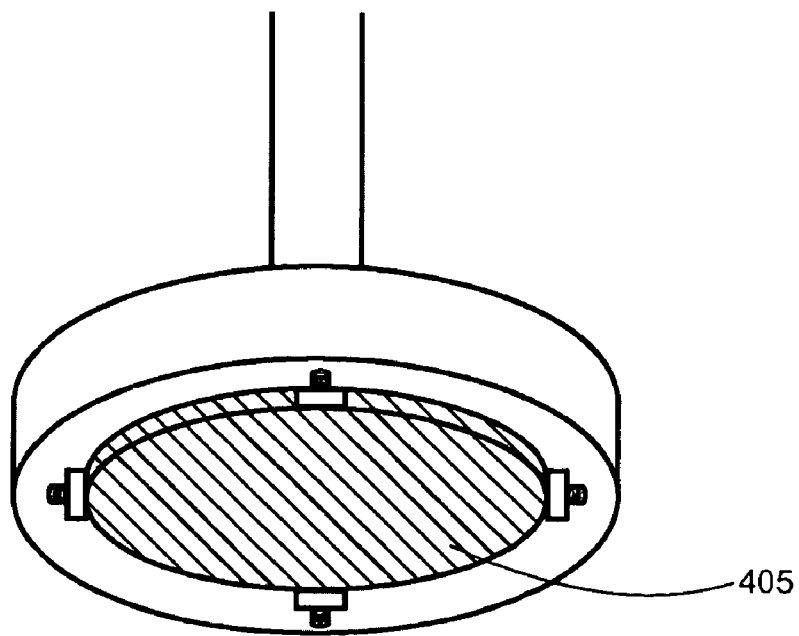
FIG. 4B is a simplified illustration showing how adjustments of distances between gripping components allow the gripping components to hold a radiation source of a particular shape and size.

FIG. 4B is a simplified drawing of semiconductor sample holder 400 holding an exemplary semiconductor sample 405. Through adjustments of $d_1$ and $d_2$ described above, semiconductor sample holder 400 is adapted to hold a semiconductor sample 405 of a plurality of shapes and sizes.

Figure 4C:
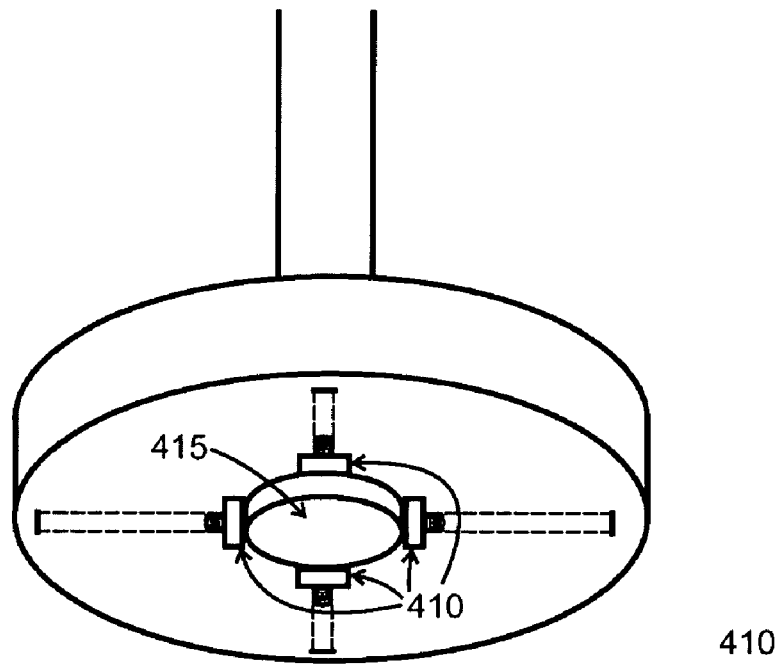
FIG. 4C is a simplified illustration showing how adjustments of distances between gripping components allow the gripping components to hold a radiation source of another particular shape and size.

FIG. 4C is a simplified drawing of semiconductor sample holder 400 holding an exemplary semiconductor sample 415 with a smaller diameter than that of exemplary semiconductor sample 405 shown in FIG. 4B. According to the embodiment, the positions of plurality of springs 410 has been adjusted to fit semiconductor sample 415 with the smaller diameter.

Figure 4D:
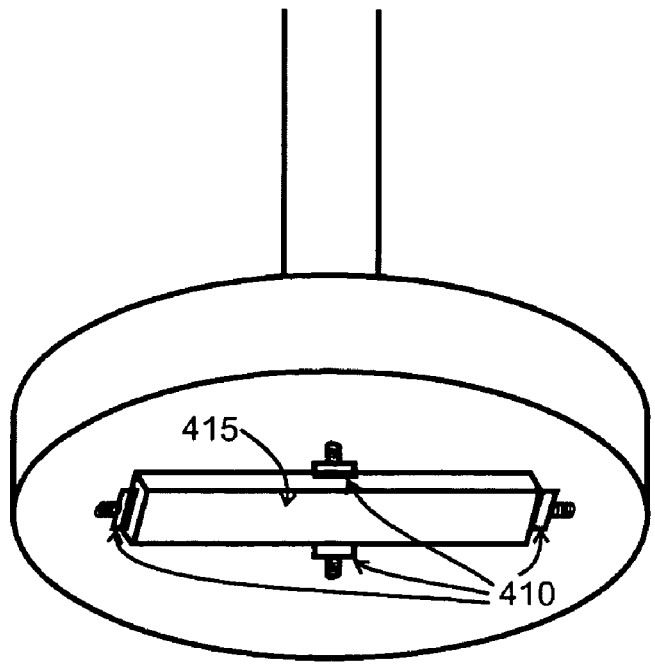
FIG. 4D is a simplified illustration showing how adjustments of distances between gripping components allow the gripping components to hold a radiation source of yet another particular shape and size.

FIG. 4D is a simplified drawing of semiconductor sample holder 400 holding an exemplary semiconductor sample 425 with a rectangular shape. According to the embodiment, the positions of plurality of springs 410 have been adjusted such that $d_1$ and $d_2$ can be made significantly different from each other. According to the embodiment, plurality of gripping components can be adapted to hold a semiconductor sample with a variety of shapes and sizes, including a semiconductor sample with a rectangular shape.

Figure 5A:
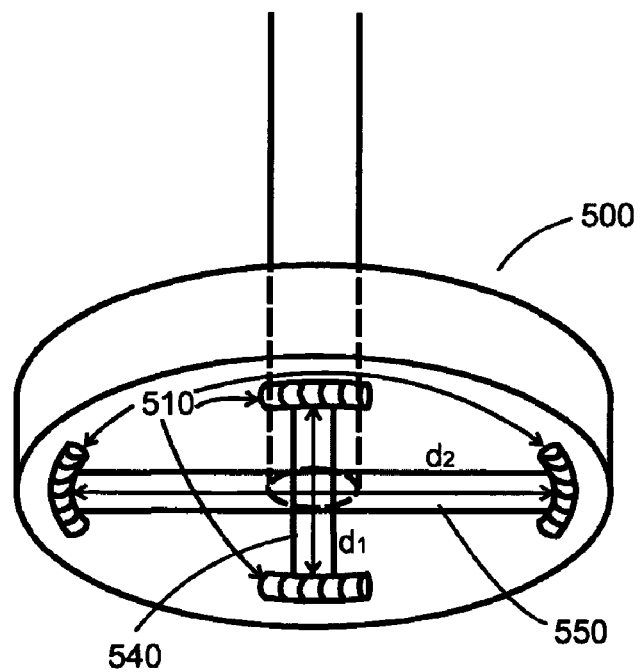
FIG. 5A is a simplified illustration of a radiation holder with 4 gripping components where the distances between the gripping components can be externally adjusted to hold a radiation source of a variety of shapes and sizes.

FIG. 5A is a simplified drawing of a semiconductor sample holder 500 with a plurality of gripping components 510. According to an embodiment, semiconductor sample holder 500 has four gripping components spaced apart about a circumference of semiconductor sample holder 500. Plurality of gripping components 510 can be adjusted so the distances $d_1$ and $d_2$ can be varied.

Figure 5B:
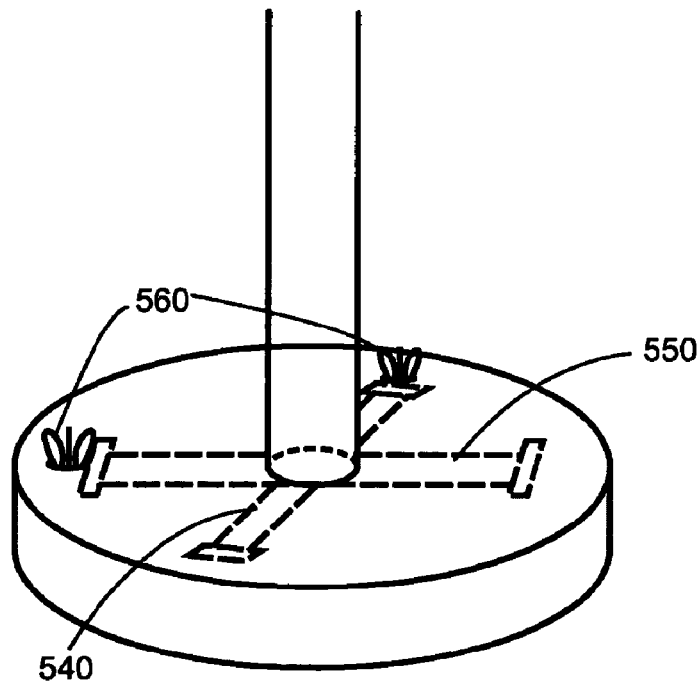
FIG. 5B is a simplified illustration of a top view of a radiation holder showing adjusting screws and a pair of guides along which gripping components can slide, changing the distances between the gripping components to hold a radiation source of a variety of shapes and sizes.

FIG. 5B is a simplified drawing of semiconductor sample holder 500 from a top view. According to the embodiment, semiconductor sample holder 500 contains a pair of screws 560 for adjusting distances $d_1$ and $d_2$ along a set of guides 540 and 550 along which plurality of gripping components may slide. According to the embodiment, the pair of screws allow the distances $d_1$ and $d_2$ to be changed independently of each other. According to one embodiment, semiconductor sample holder 500 contains only one screw, whereby distances $d_1$ and $d_2$ are related to each other and may be changed together with adjustment of the one screw.

Figure 6A:
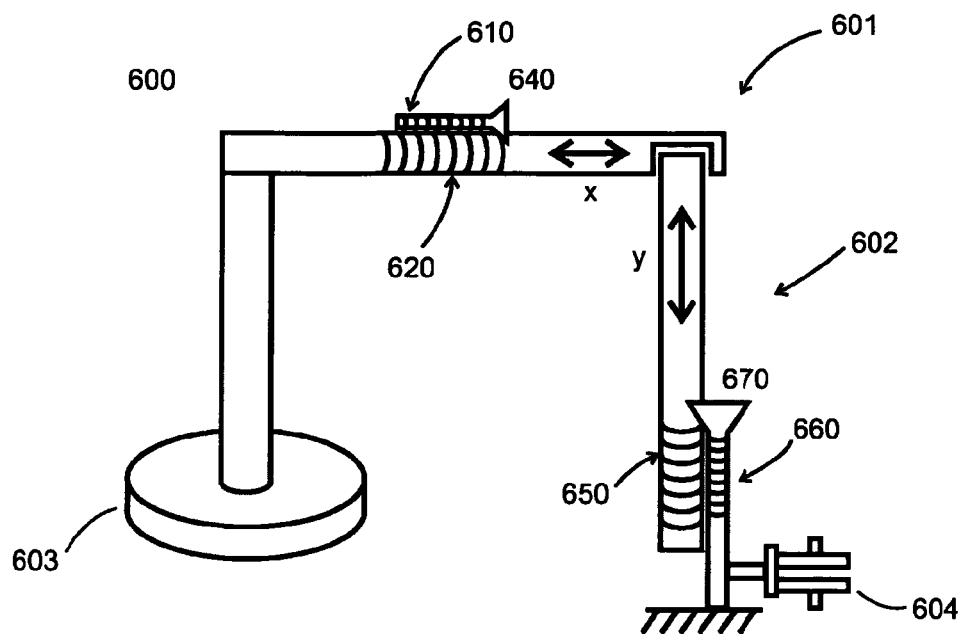
FIG. 6A is a simplified illustration of a plurality of mechanisms for adjusting a length of an arm and a height of a column according to an aspect of the invention.

FIG. 6A is a simplified drawing of an apparatus 600 for a user to conduct an accelerated soft error test (ASER) on a semiconductor sample (not shown). According to an embodiment, apparatus 600 includes an adjustable arm 601 for moving a radiation source holder 603 along an x direction with respect to a semiconductor sample holder 604. Apparatus 600 includes an adjustable column 602 for moving radiation source holder 603 along a y direction with respect to semiconductor sample holder 604.

According to the embodiment, adjustable arm 601 includes a threaded surface section 620 and a screw component 640 having a complementary threaded surface 610. When screw component 640 is adjusted, the length of arm 601 may be adjusted along an x direction. Similarly, according to an embodiment, adjustable column 602 includes a threaded surface section 650 and a screw component 670 having a complementary threaded surface 660. When screw component 670 is adjusted, the height of column 602 may be adjusted along an y direction.

Figure 6B:
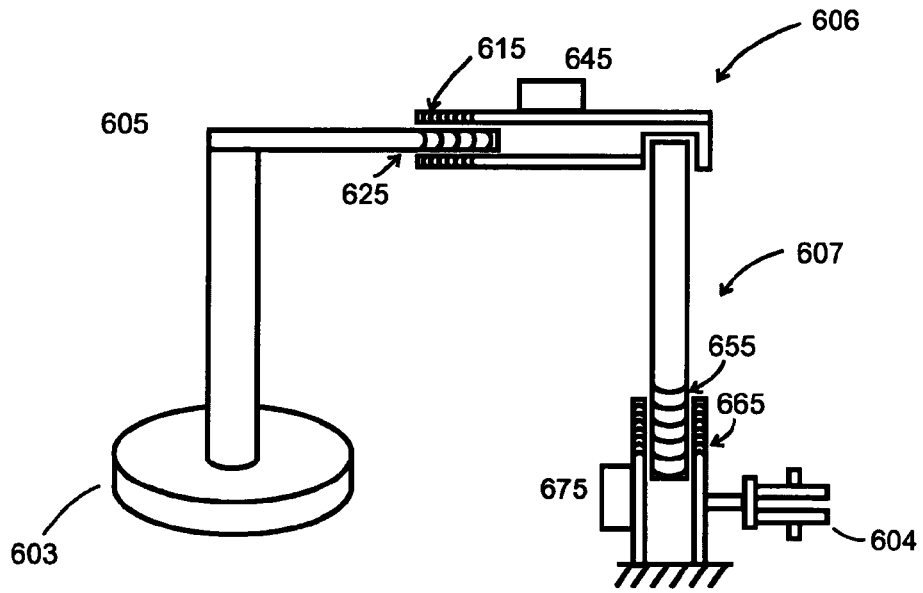
FIG. 6B is a simplified illustration similar to the embodiment shown in FIG. 6A, except that the components for adjusting the arm and the column are coupled to motorized components.

FIG. 6B is a simplified drawing of an apparatus 605 for a user to conduct an accelerated soft error test (ASER) on a semiconductor sample (not shown). According to an embodiment, unlike apparatus 600 illustrated in FIG. 6A, apparatus 605 includes a mechanized adjustable arm 606 for moving a radiation source holder 603 along an x direction and a mechanized adjustable column 607 for moving radiation source holder 603 along a y direction.

According to the embodiment, adjustable arm 606 includes a threaded surface section 625 and a mechanized component 645 having a complementary threaded surface 615. When mechanized component 640 is activated, the length of arm 606 may be adjusted along an x direction. Similarly, according to an embodiment, adjustable column 607 includes a threaded surface section 655 and a mechanized component 675 having a complementary threaded surface 665. When mechanized component 675 is activated, the height of column 607 may be adjusted along a y direction.

Figure 7A:
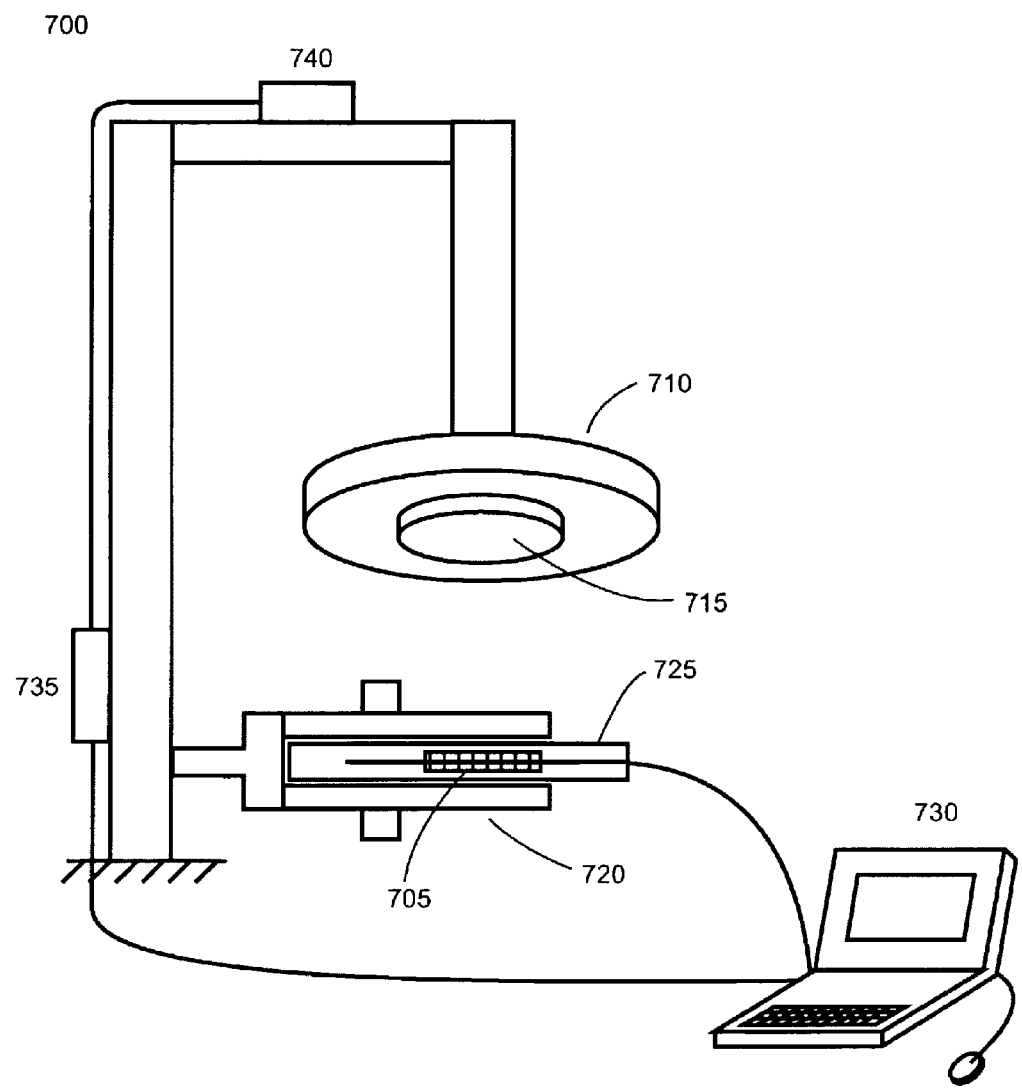
FIG. 7A is a simplified illustration of connections to a computer system for monitoring and controlling motorized components and BIB or DUT board.

FIG. 7A is a simplified drawing of an apparatus 700 for a user to conduct an accelerated soft error test (ASER) on a semiconductor sample 705. According to an embodiment, apparatus 700 comprises a radiation holder 710 for holding a radiation source 715, a semiconductor sample holder 720 for holding a test apparatus 725 such as a BIB or DUT board coupled to a semiconductor sample 705. According to the embodiment, test apparatus 725 may be coupled to a computer system 730. An exemplary computer system 730 is adapted to read failure bit count signals generated when semiconductor sample 705 is subject to a radiation stress from radiation source 715. According to an embodiment, computer system 730 may also be adapted to control mechanized components 735 and 740 for adjusting the placement of radiation sample 715 from semiconductor sample 705, and hence the radiation stress subjected by radiation sample 715 on semiconductor sample 705.

Figure 7B:
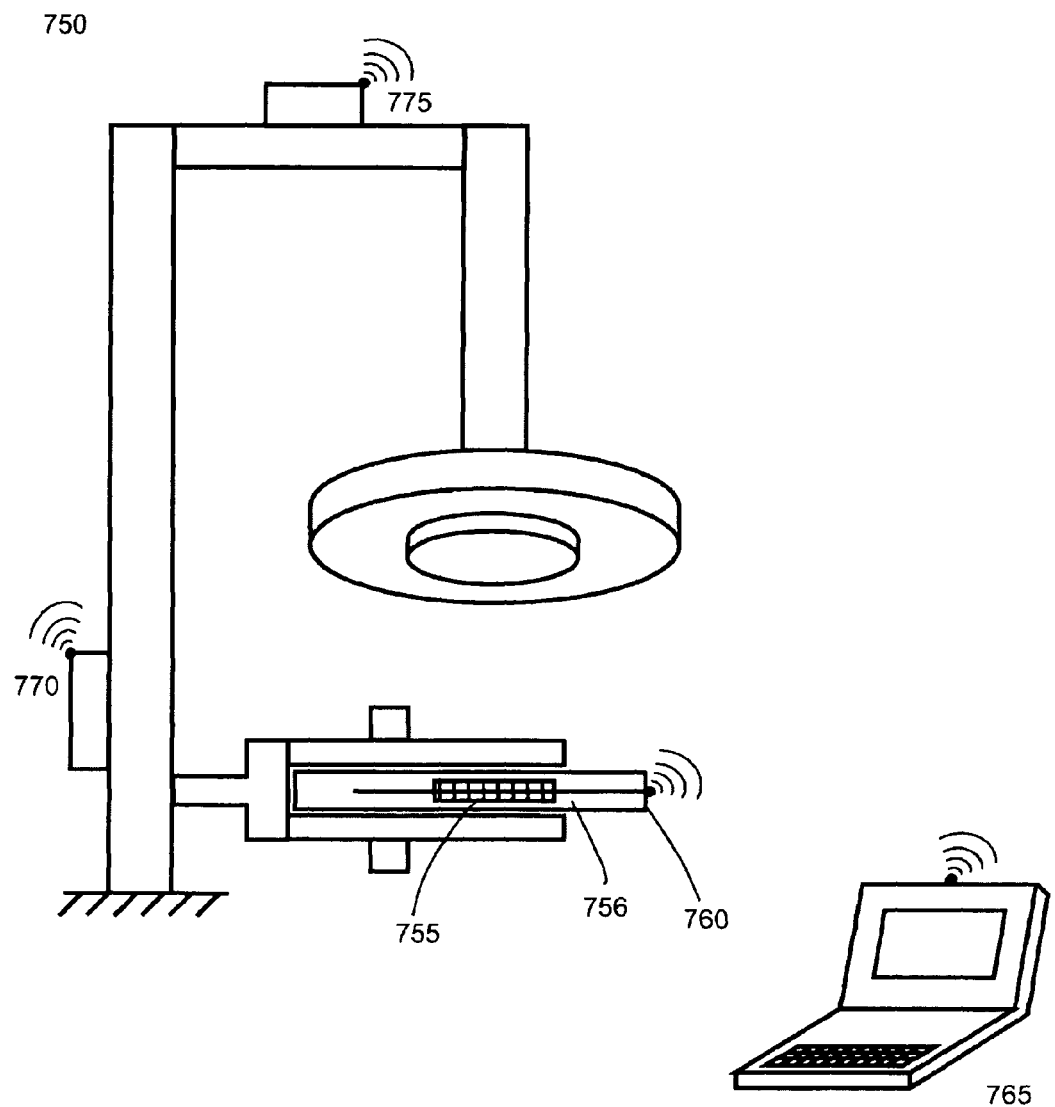
FIG. 7B is a simplified illustration similar to the embodiments shown in FIG. 7A, except the connections are wireless.

FIG. 7B is a simplified drawing of an apparatus 750 for a user to conduct an accelerated soft error test (ASER) on a semiconductor sample 755. A primary difference between the embodiments shown in FIG. 7B and FIG. 7A is the use of wireless communication components in the embodiment of FIG. 7B. According to an embodiment, a test apparatus 760 is equipped with a wireless communication component for transmitting failure bit count signals to computer system 765. According to an embodiment, computer system 765 includes a wireless component for communicating with test apparatus 760. According to the embodiment, mechanized components 770 and 775 for adjusting the position of radiation source 780 with respect to semiconductor sample 755 are adapted to communicate wirelessly with communicating devices such as computer system 765. According to the embodiment, BIB or DUT board 756, to which semiconductor sample 755 is coupled, is also adapted to communicate wirelessly with communicating devices such as computer system 765.

Figure 8A:
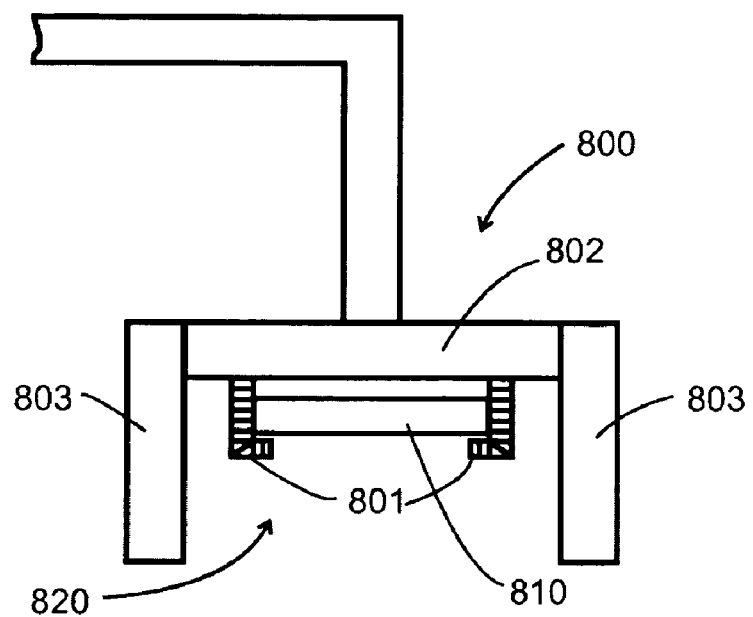
FIG. 8A is a simplified illustration of a close-up of a radiation holder with a shielding portion that reduces an amount of radiation from escaping from the sides.
Figure 8B:
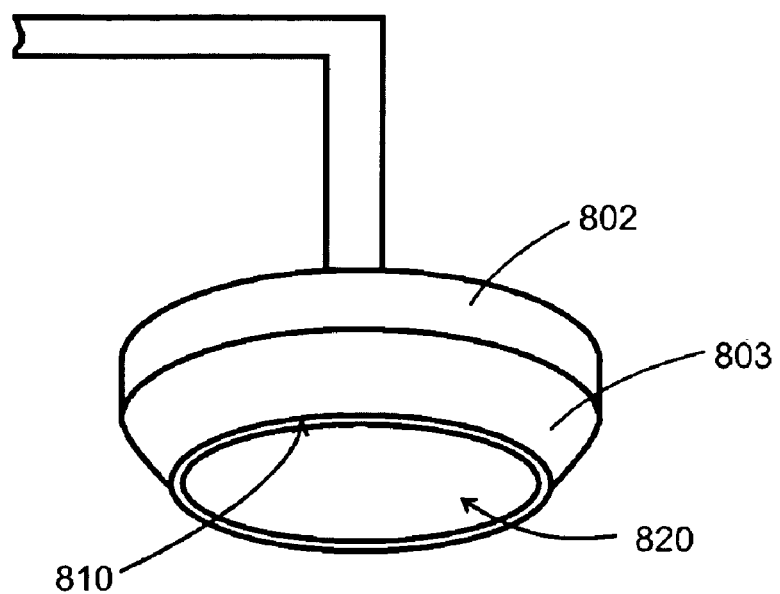
FIG. 8B is a simplified illustration of another view of the radiation holder shown in FIG. 8A.

FIG. 8A and FIG. 8B are simplified drawings of a radiation source holder 800 adapted to provide a shielding to reduce an amount of radiation when an operator is exposed to radiation source 810. According to an embodiment, radiation source holder 800 comprises a gripping subassembly 801 for holding radiation source 810, a base portion 802, and a shield portion 803. An exemplary radiation source 810 may be an alpha-particle source or a neutron particle source. According to an embodiment, base portion 802 and shield portion 803 are preferably shielded against radiation so most of the radiation emitting from radiation source 810 is guided through opening 820 and does not leak out from the top or sides of radiation source holder 800.

FIG. 9A through FIG. 9D are simplified drawings of a radiation source holder 900 with an aperture shield component 920 adapted to control when and how much radiation is allowed to emit out of source holder 900. According to an embodiment, radiation source holder 900 comprises a gripping subassembly 901 for holding radiation source 910, a base portion 902, and a side shield portion 903, and aperture shield component 920. An exemplary radiation source 910 may be an alpha-particle source or a neutron particle source.

According to an embodiment, aperture shield component 920 is adapted to vary from a closed position to an open position.

Figure 9A:
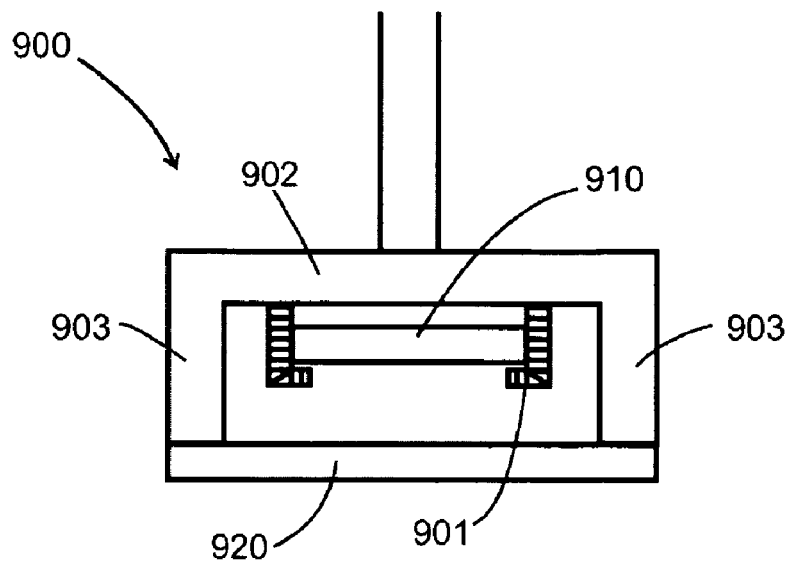
FIG. 9A is a simplified illustration of a close up of a radiation holder with a shielding aperture that can open and close and be adjusted to a variety of diameters.
Figure 9B:
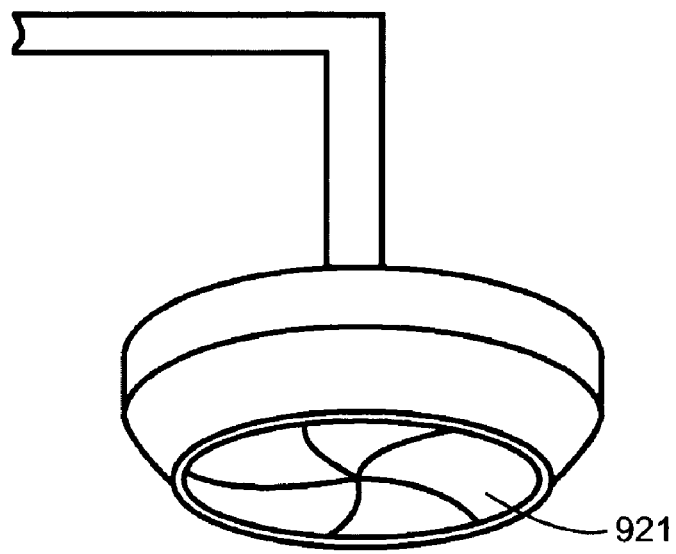
FIG. 9B is a simplified illustration of an isometric view of a radiation holder with a shielding aperture in a closed position.

FIG. 9B shows aperture shield component 920 at a closed position 921 according to an embodiment. In position 921, little if any radiation emitted by radiation source 910 is released from aperture shield component 920.

Figure 9C:
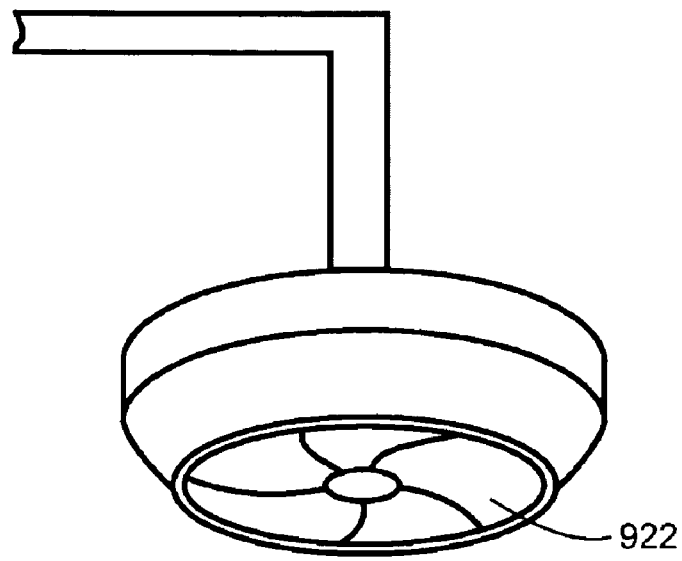
FIG. 9C is a simplified illustration of an isometric view of a radiation holder with a shielding aperture in a partially open position.

FIG. 9C shows aperture shield component 920 at a half open position 922 according to an embodiment. In position 922, some radiation emitted by radiation source 910 is released from aperture shield component 920. The exact amount of radiation released is dependent on the size of the opening of aperture shield component 920 at position 922.

Figure 9D:
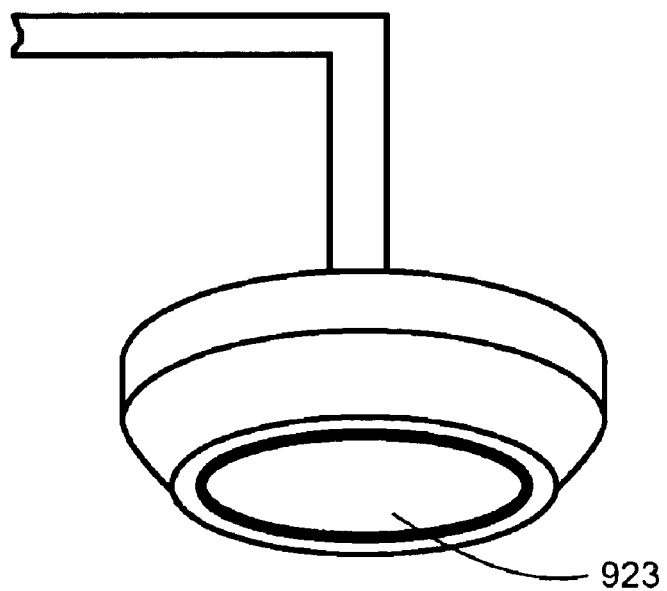
FIG. 9D is a simplified illustration of an isometric view of a radiation holder with a shielding aperture in a completely open position.

FIG. 9D shows aperture shield component 920 at a fully open position 923 according to an embodiment. In position 923, a maximum amount of radiation emitted by radiation source 910 is released from aperture shield component 920. The exact amount of radiation released is dependent on the size of the opening of aperture shield component 920 at position 923.

Figure 10:
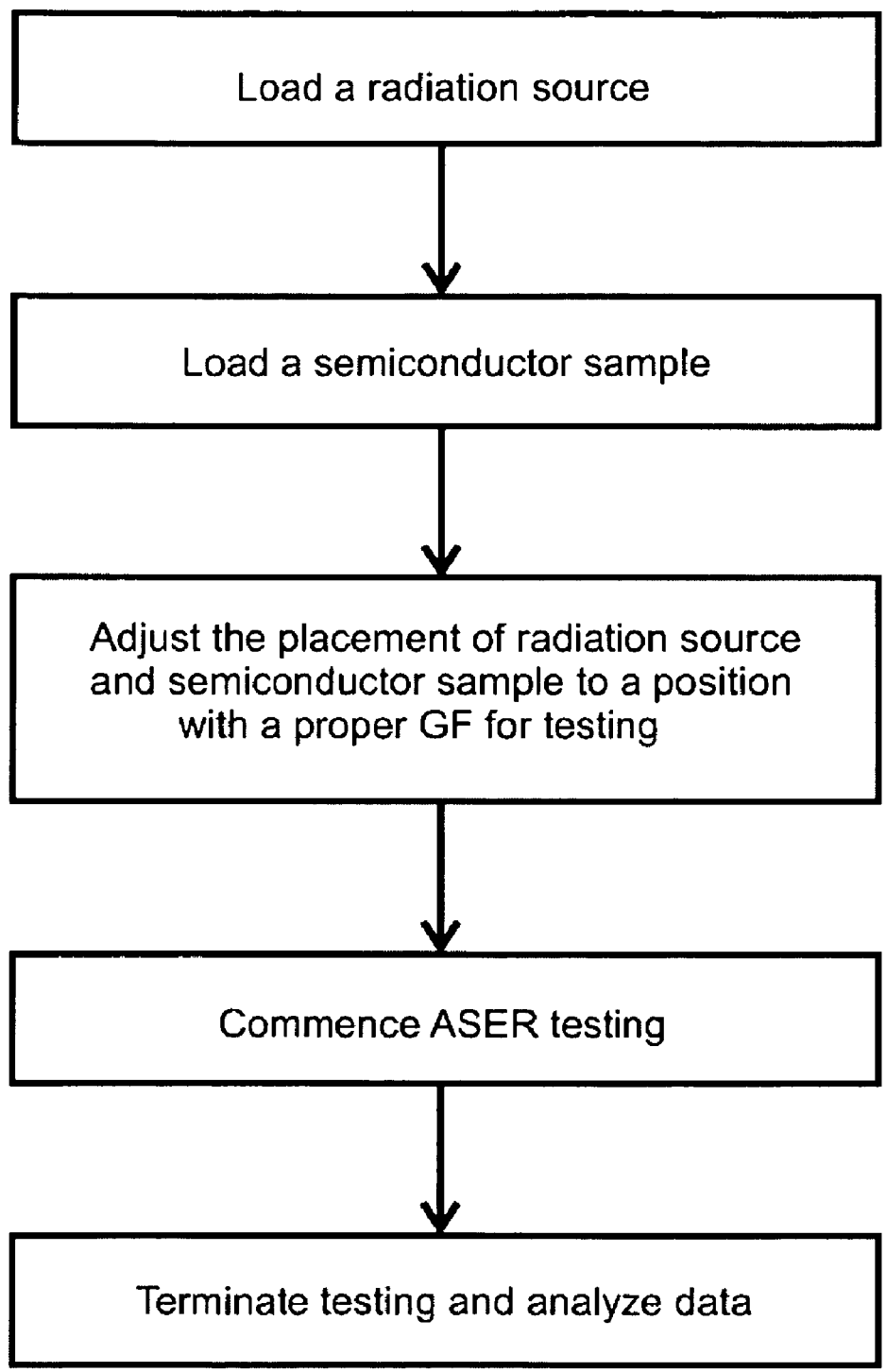
FIG. 10 is a simplified illustration of a method according to an aspect of the current invention.

FIG. 10 shows a simplified illustration of a method for conducting ASER test according to an embodiment of the current invention. According to an embodiment, the method includes setting up an appropriately shielded apparatus for testing. The method includes loading a radiation source and loading a semiconductor sample in the properly shielded apparatus. The method includes adjusting the configuration of the apparatus to place the radiation source and the semiconductor sample relative to each other at a proper Geometric Factor for testing. The method includes commencing testing. The method includes terminating testing and analyzing data gathered from the test to ascertain an ASER FIT level.

During testing, a further series of adjustments of the placement of radiation source and semiconductor sample with a further series of GF may be possible. The further adjustments may also include adjustments of a shielding component as illustrated in FIG. 9A-FIG. 9D. The testing may also include a reloading of a radiation source. For example, a test may include a use of an alpha-particle source for a first period of time at a first GF and a use of an neutron-particle source for a second period of time at a second GF.

The invention above has been disclosed through various examples and embodiments. It is understood that the examples and embodiments described herein are for illustrative purposes only. Various modifications or changes in light thereof will be suggested to persons skilled in the art. For example, an exemplary apparatus may include more than one radiation holder. According to an embodiment with a plurality of radiation holders may be provided. According to a specific embodiment, each radiation holder is adapted to hold a radiation source of a different radiation type and/or radiation strength.

As another example, an ASER test may be designed where more than the positions of radiation sources are adjusted in defining a GF for testing. In general, according to an embodiment, an apparatus may be adapted where radiation sources are moved, where semiconductor samples are moved, or where both semiconductor samples and radiation sources are moved in adjusting for a target GF. An apparatus may also be adapted where adjustments in a shielding component, such as in FIG. 9A-FIG. 9D, to define a target GF. Other variations exist, and these various modifications or changes in light thereof are considered to be included within the spirit and purview of this application and scope of the appended claims.

What is claimed is:

1. An apparatus for a user to conduct an accelerated soft error test (ASER) on a semiconductor sample using radiation from a radiation source, the apparatus comprising:
a first component for holding the radiation source, the first component adapted to holding a radiation source of a plurality of sizes and shapes;
a second component for holding the semiconductor sample, the second component adapted to holding a semiconductor material of a plurality of sizes and shapes; and
a connecting assembly coupled to the first component and coupled to the second component, the connecting subassembly adapted to place the first component and the second component relative to each other at a plurality of positions, the plurality of positions including a plurality of testing positions, a first loading position, and a second loading position, each of the plurality of testing positions being characterized by a Geometric Factor (GF) adapted to subject the semiconductor sample to a radiation stress, the Geometric Factor describing a stress efficiency of the radiation stress applied to the semiconductor sample, the first loading position configured to place the radiation source at a position and an orientation convenient for the user to load and unload the radiation source, and the second loading position configured to place the semiconductor sample at a position and an orientation convenient for the user to load and unload the semiconductor sample.

2. The apparatus of claim 1 wherein the stress efficiency is characterized by the Geometric Factor (GF).

3. The apparatus of claim 1 wherein the stress efficiency is characterized by a particle flux associated with the radiation source.

4. The apparatus of claim 1 wherein the stress efficiency is characterized by a particle flux associated with the semiconductor sample.

5. The apparatus of claim 1 wherein the connecting assembly includes an arm subassembly, the arm subassembly adapted to be adjustable in length.

6. The apparatus of claim 5 wherein the connecting assembly further includes a column assembly, the column assembly adapted to be adjustable in height.

7. The apparatus of claim 6, the radiation source characterized by a first dimension, the semiconductor sample characterized by a second dimension, wherein the Geometric Factor is further characterized by the first dimension, the second dimension, and the height.

8. The apparatus of claim 7 wherein the first dimension is related to a diameter of the radiation source and wherein the second dimension is related to a diameter of the semiconductor sample.

9. The apparatus of claim 6, wherein the height is greater than 0 mM.

10. The apparatus of claim 6, wherein the height is less than 30 mM.

11. The apparatus of claim 6, the column assembly including a first surface and a scaling component, the first surface characterized by a first thread, the scaling component including a second surface, the second surface characterized by a second thread, the first thread and the second thread being matching threads whereby an adjustment of the scaling component will result in a change of the height of the column assembly.

12. The apparatus of claim 11 wherein the scaling component includes a threaded screw.

13. The apparatus of claim 6, the column assembly characterized by a first end, and a second end, wherein the arm subassembly is coupled to the column assembly toward the first end of the column subassembly and wherein the second component is coupled to the column assembly toward the second end of the column subassembly.

14. The apparatus of claim 13, the column assembly characterized by a longitudinal axis, wherein the arm subassembly is adapted to pivot about the longitudinal axis.

15. The apparatus of claim 1 wherein the first component includes a dish-like subassembly characterized by a diameter.

16. The apparatus of claim 15 wherein the first component is adapted to vary the diameter.

17. The apparatus of claim 1 wherein the first component includes a plurality of gripping components adapted to physically hold the semiconductor material.

18. The apparatus of claim 17 wherein the plurality of gripping components includes a plurality of springs.

19. The apparatus of claim 17, the plurality of gripping components separated from each other by a plurality of distances, wherein at least one the plurality of distances is adapted to be adjustable.

20. The apparatus of claim 17 wherein at least one of the plurality of distances is adapted to be adjusted independently of another of the plurality of distances.

21. The apparatus of claim 17, the plurality of gripping components arranged in a plurality of gripping pairs, the plurality of gripping pairs associated with a plurality of gripping distances, each of the plurality of gripping pairs separated from the other of the plurality of plurality of gripping pairs by a gripping distance, the plurality of gripping distances including the gripping distance, wherein the plurality of gripping distances is adjustable to accommodate for a plurality of shapes and sizes of the radiation source.

22. The apparatus of claim 17, the first component including a perimeter, wherein the plurality of gripping components is spaced apart approximately equidistant from each other along the perimeter.

23. The apparatus of claim 22 wherein the plurality of gripping components includes four gripping components.

24. The apparatus of claim 1 wherein the semiconductor sample is characterized by a disc-like shape.

25. The apparatus of claim 24 wherein the disc-like shape is characterized by a diameter of between 25 mm and 30 mm.

26. The apparatus of claim 24 wherein the disc-like shape is characterized by a thickness of between 5 mm and 10 mm.

27. The apparatus of claim 1 wherein the first component includes a shield component.

28. The apparatus of claim 1 wherein the first component includes a soft pad.

29. The apparatus of claim 1 wherein the first component includes an insulating pad.

30. The apparatus of claim 1 wherein the second component includes a soft pad.

31. The apparatus of claim 1 wherein the second component includes an insulating pad.

32. The apparatus of claim 1 wherein the semiconductor sample is coupled to a device-under-test (DUT) board.

33. The apparatus of claim 1 wherein the semiconductor sample is coupled to a burn-in-board (BIB).

34. The apparatus of claim 1 wherein the semiconductor sample is a semiconductor chip.

35. The apparatus of claim 1 wherein the semiconductor sample is a semiconductor wafer.

36. The apparatus of claim 1 wherein the semiconductor sample is coupled to a computer control and monitoring system.

37. The apparatus of claim 1 wherein the apparatus is coupled to a computer control and monitoring system.

38. The apparatus of claim 1 wherein the radiation source is an alpha-particle source.

39. The apparatus of claim 1 wherein the radiation source is a neutron-particle source.

40. The apparatus of claim 1, the first component further comprising an aperture shield assembly, wherein the aperture shield assembly is adapted to control an amount of radiation from the radiation source allowed to leave the first component.

41. The apparatus of claim 40 wherein the aperture shield assembly is coupled to a computer control and monitoring system.

42. A method for a user to conduct an accelerated soft error test (ASER) on a semiconductor sample using radiation from a radiation source, the method comprising:
    setting up and initializing an apparatus;
    providing for a radiation source;
    providing for a semiconductor sample;
    providing for a configuration of the apparatus, the configuration placing the radiation source and the semiconductor sample at a position characterized by a GF for an accelerated soft error test;
    commencing the accelerated soft error test; and
    terminating the accelerated soft error test.

43. The method of claim 42 further comprising analyzing data obtained from the accelerated soft error test.

44. The method of claim 42 further comprising providing for at least an additional configuration of the apparatus, the at least additional configuration placing the radiation source and the semiconductor sample at an additional position characterized by an additional GF.

45. The method of claim 42 further comprising:
    providing for at least an additional radiation source; and
    providing for at least an additional configuration of the apparatus, the at least additional configuration placing the at least additional radiation source and the semiconductor sample at a n additional position involving the additional radiation source and the semiconductor sample.

46. The method of claim 42 wherein the providing for a radiation source includes selecting a radiation source from a group of radiation sources including an alpha-particle source and a neutron-particle source.

47. The method of claim 42 wherein the providing for a configuration of the apparatus includes adjusting an arm subassembly and a column subassembly of the apparatus.

48. The method of claim 42 wherein the providing for a configuration of the apparatus includes adjusting the arm subassembly and the column subassembly manually by hand.

49. The method of claim 42 wherein the providing for a configuration of the apparatus includes adjusting the arm subassembly and the column subassembly by motorized components.

50. The method of claim 42 wherein the providing for a configuration of the apparatus includes adjusting the arm subassembly and the column subassembly through a computer system.

51. The method of claim 42 further comprising adjusting an aperture component to control an amount of radiation allowed to leave the radiation source and expose the semiconductor sample.

52. The method of claim 42 further comprising providing for a burn-in-board (BIB) or device-under-test (DUT) board to which the semiconductor sample is coupled.

53. The method of claim 42 further comprising coupling signals from the semiconductor sample to a computer system.

* * * * *